United States Patent
Abe et al.

(10) Patent No.: US 6,285,257 B1
(45) Date of Patent: Sep. 4, 2001

(54) FEEDBACK TYPE VARIABLE GAIN AMPLIFIER

(75) Inventors: Hiroyuki Abe, Chigasaki; Hironori Nagasawa, Yokohama, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/521,897

(22) Filed: Mar. 9, 2000

(30) Foreign Application Priority Data

Mar. 10, 1999 (JP) .................................................. 11-063902

(51) Int. Cl.[7] .............................. H03G 3/12; H03F 1/36; H03F 3/16; H03F 1/34
(52) U.S. Cl. ........................... 330/282; 330/86; 330/277; 330/294
(58) Field of Search ............................. 330/86, 277, 282, 330/294

(56) References Cited

U.S. PATENT DOCUMENTS

| | | | | |
|---|---|---|---|---|
| 4,366,450 | * | 12/1982 | Suganuma | 330/277 |
| 4,439,741 | * | 3/1984 | Turner, Jr. | 330/149 |
| 5,051,705 | * | 9/1991 | Moghe et al. | 330/277 |
| 5,570,064 | * | 10/1996 | Sugawara | 330/282 |
| 5,590,412 | * | 12/1996 | Sawai et al. | 330/282 |

FOREIGN PATENT DOCUMENTS 11-298268   10/1999   (JP) .

OTHER PUBLICATIONS

K. Nishikawa, et al., Proceedings of the 1995 Electronics Society Conference of IEICE, vol. 2, p. 65, "Thermal Stability of Low–Distortion Variable–Gain Amplifier Using Active Feedback," Sep. 1995.

* cited by examiner

Primary Examiner—Robert Pascal
Assistant Examiner—Patricia T. Nguyen
(74) Attorney, Agent, or Firm—Oblon, Spivak, McClelland, Maier & Neustadt, P.C.

(57) ABSTRACT

A feedback type variable gain amplifier of the present invention is provided with a first inductor and a first field effect transistor connected in series across a power-supply potential terminal and a ground potential terminal, the one end of the first inductor connecting to the power-supply potential terminal, the one end of the first field effect transistor connecting to the ground potential terminal, the gate of the first field effect transistor being used as a signal input terminal, and the other end of the first field effect transistor being used as a signal output terminal, a second inductor, a second field effect transistor and a capacitor connected in series between the drain and the gate of the first field effect transistor, and, a resistor connected between the drain and the gate of said second field effect transistor.

15 Claims, 2 Drawing Sheets

FEEDBACK TYPE VARIABLE GAIN AMPLIFIER

BACKGROUND OF THE INVENTION

1. Field of the Invention

The present invention relates to a feedback type variable gain amplifier, which is specifically suitable to an amplifier used for high frequency band, UHF or higher band.

2. Related Background Art

FIG. 1 shows a circuit diagram of a conventional feedback type variable gain amplifier.

The conventional feedback type variable gain amplifier is provided with an amplifier AMP31, and a gain control circuit GC31 which is a feedback circuit coupled to the amplifier AMP31 and controls a value of the gain. The amplifier AMP31 includes a series-connected high frequency cutoff inductor L31 and amplifying field effect transistor FET31 across a power-supply potential terminal Vdd and a ground potential terminal GND. The gate of the transistor FET31 is used as a signal input terminal Vin, and the drain is used as a signal output terminal Vout. The gain control circuit GC31 includes a series-connected gain control field effect transistor FET32 and direct-current cutoff capacitor C31 across the signal output terminal Vout and the signal input terminal Vin. Furthermore, a resistor R31 connected across the drain and the source of the gain control field effect transistor FET32.

In this conventional feedback type variable gain amplifier, the resistor R31 maintains levels at the drain and the source of the transistor FET32 to the same potential, the capacitor C31 isolates levels at the gate of the transistor FET31 from the power-supply potential Vdd. Furthermore, by varying a voltage Vgc applied to a gain control terminal G32, which is the gate of the transistor FET32, the transistor FET32 and the resistor R31 function as a variable resistor having a resistance value R(Vgc).

FIG. 2 shows a circuit diagram of an equivalent circuit of the gain control circuit GC31 in the conventional feedback type variable gain amplifier shown in FIG. 1.

The equivalent circuit of the gain control circuit GC31 is expressed by a series connection of a variable resistor R41 and a direct-current cutoff capacitor C41. And as described above, since the transistor FET32 and the resistor R31 of the gain control circuit GC31 function as a variable resistor, an impedance Z of the gain control circuit GC31 is represented as follows:

$$Z = R(Vgc) + 1/(j\omega C)$$

where, R(Vgc) is a variable resistance value between the drain and the source of the transistor FET32, and R(Vgc)<<R31.

A phase difference of a voltage to a current flowing through the circuit is represented as follows:

$$\omega = \tan^{-1}\{-1/(\omega CR)\} < 0$$

In the conventional feedback type variable gain amplifier, the direct phase difference between the input voltage and the output voltage is 180°. However, as the frequency increases, the phase difference decreases because of the shifting of the phases of the input voltage and the output voltage. The range of the phase of the impedance Z of the gain control circuit GC31 is −90°<θ<0°. The phase of the signal fedback to the input terminal Vin of the amplifier AMP31 via the gain control circuit GC31 has a value which is obtained by adding the phase difference of the gain control circuit GC31 to the phase difference of the amplifier AMP31.

In order to obtain an ideal negative feedback for the amplifier, it is desirable to feedback the signal to the input terminal of the amplifier with the phase difference 180°. However, in the conventional feedback type variable gain amplifier shown in FIG. 1, the decay of the gain is small because the phase difference of the signal fedback to the input terminal of the amplifier can not be 180°, especially in high frequency band, UHF or higher band. Consequently, there is a problem that it is difficult to expand the range of the controllable gain.

SUMMARY OF THE INVENTION

It is an object of the present invention to provide a feedback type variable gain amplifier having a wide range of the controllable gain even in high frequency bands.

According to the present invention, a feedback type variable gain amplifier of the present invention is provided with a first inductor and a first field effect transistor connected in series across a power-supply potential terminal and a ground potential terminal, the one end of the first inductor connecting to the power-supply potential terminal, the one end of the first field effect transistor connecting to the ground potential terminal, the gate of the first field effect transistor being used as a signal input terminal, and the other end of the first field effect transistor being used as a signal output terminal, a second inductor, a second field effect transistor and a capacitor connected in series across the drain and the gate of the first field effect transistor, and, a resistor connected across the drain and the gate of said second field effect transistor. Since the second inductor is connected to the capacitor in series between the drain and the gate of the first field effect transistor, the imaginary part of the impedance of the gain control circuit which includes the second inductor, the second field effect transistor, the capacitor and the resistor is controllable, it will become capable to widen the range of the gain control in high frequency bands, especially in UHF or higher frequency bands by controlling the phase of the signal feedback to the signal input terminal of the amplifier.

To achieve the widest range of the gain control, in a feedback type variable gain amplifier according to the present invention, the values of the inductance of said second inductor and the capacitance of said capacitor are set to the proper values so that the phase difference between the signal input to the gate of said first field effect transistor and the signal fedback to the gate of said first field effect transistor via said second inductor, said second field effect transistor and said capacitor is approximately 180° when the value of the resistance between the drain and the source of said second field effect transistor is set to the minimum value by controlling the voltage applied to the gate of said second field effect transistor. In other words, by setting the impedance of the gain control circuit so that the signal supplied to the gate of the first field effect transistor and the signal feedback to the gate of the first field effect transistor via the gain control circuit cancel each other and the decay of the gain comes to larger when the amount of feedback signal of the gain control circuit which is the feedback circuit, it will become capable to obtain the widest range of the gain control by varying the gate potential of the second field effect transistor arranged in the gain control circuit.

BRIEF DESCRIPTION OF THE DRAWINGS

In the attached drawings.

DESCRIPTION OF THE PREFERRED EMBODIMENT

Referring to the attached drawings, a feedback type variable gain amplifier according to the present invention will be described hereinafter.

Figure 1:
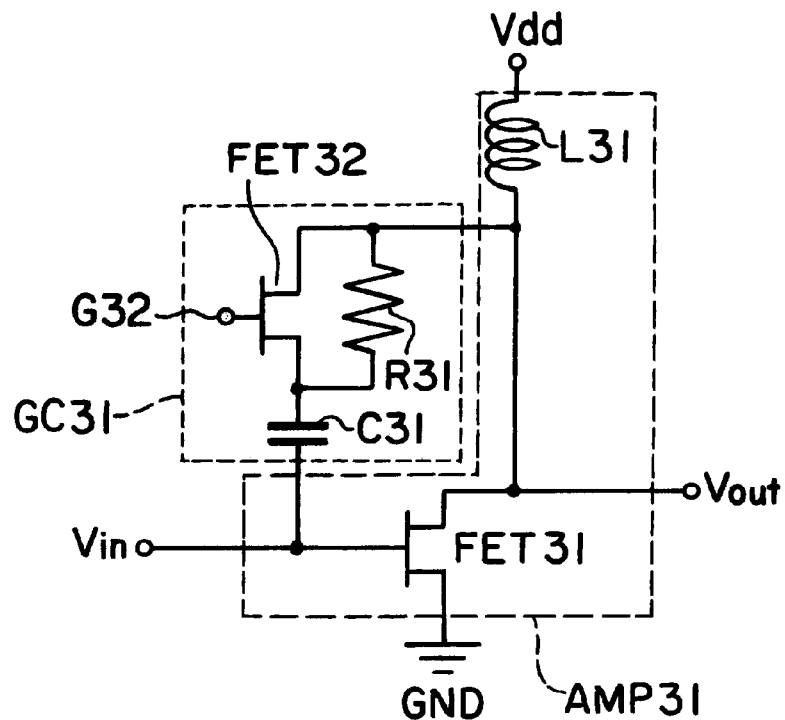
FIG. 1 shows a circuit diagram of a conventional feedback type variable gain amplifier.
Figure 2:
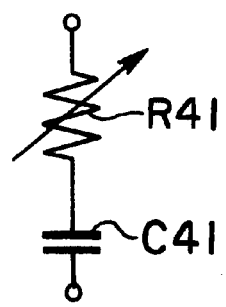
FIG. 2 shows a circuit diagram of an equivalent circuit of the gain control circuit GC31 used in the conventional feedback type variable gain amplifier shown in FIG. 1.
Figure 3:
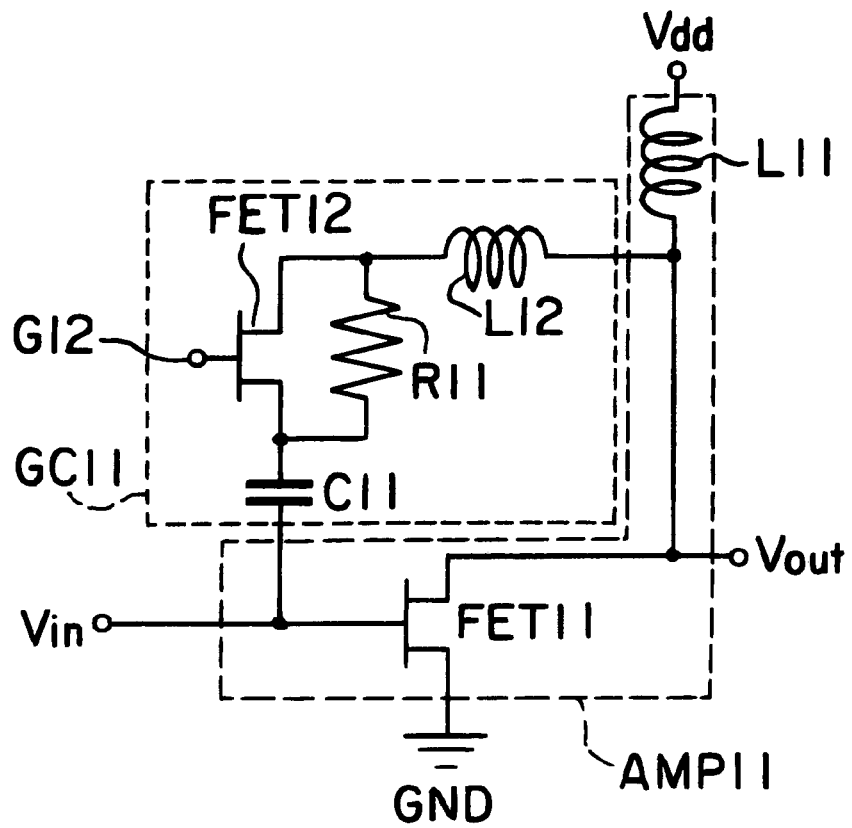
FIG. 3 shows a circuit diagram of a feedback type variable gain amplifier according to the one embodiment of the present invention.

FIG. 3 shows a circuit diagram of a feedback type variable gain amplifier according to the one embodiment of the present invention.

The feedback type variable gain amplifier according to the present invention is provided with an amplifier AMP11, and a gain control circuit GC11 which is a feedback circuit coupled to the amplifier AMP11 and controls a value of the gain. The construction of the amplifier AMP11 and of the conventional amplifier AMP31 are the same. That is, the amplifier AMP11 includes a series-connected high frequency cutoff inductor L11 and amplifying field effect transistor FET11 across a power-supply potential terminal Vdd and a ground potential terminal GND. One end of the inductor L11 is connected to the power-supply potential terminal Vdd and one end of the transistor FET11 is connected to the ground potential terminal GND. The gate of the transistor FET11 is used as a signal input terminal Vin, and the drain is used as a signal output terminal Vout.

On the other hand, the gain control circuit GC11 includes a series-connected inductor L12, gain control field effect transistor FET12 and direct-current cutoff capacitor C11 across the signal output terminal Vout and the signal input terminal Vin. Furthermore, a resistor R11 connected across the drain and the source of the transistor FET12. Therefore, the construction of the gain control circuit GC11 of the feedback type variable gain amplifier according to the present invention is different from that of the gain control circuit GC31 of the conventional feedback type variable gain amplifier in that the inductor L12 is interposed and is connected across the signal output terminal Vout and the signal input terminal Vin in series to the transistor FET12 and the capacitor C11.

In the feedback type variable gain amplifier according to the present invention, in the same way as the conventional feedback type variable gain amplifier, the resistor R11 maintains levels at the drain and the source of the transistor FET12 to the same potential. The direct-current cutoff capacitor C11 isolates levels at the gate of the transistor FET11 from the power-supply potential Vdd. Furthermore, by varying a voltage Vgc applied to a gain control terminal G12, which is the gate of the transistor FET12, the transistor FET12 and the resistor R11 function as a variable resistor having a resistance value R(Vgc).

Moreover, in the feedback type variable gain amplifier according to the present invention, it is capable to widen the variable range of the phase difference between the input signal and the output signal so that the inductor L12 and the capacitor C11 are connected in series across the signal output terminal Vout and the signal input terminal Vin to control the imaginary art of the impedance of the gain control circuit GC11. Therefore, the inductor L12 may be connected wherever across the signal output terminal Vout and the signal input terminal Vin as long as the inductor L12 is connected in series with the transistor FET12 and the capacitor C11.

Figure 4:
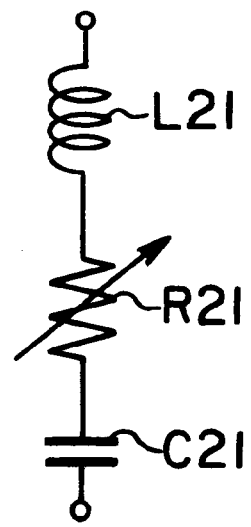
FIG. 4 shows a circuit diagram of an equivalent circuit of the gain control circuit GC11 used in the feedback type variable gain amplifier according to the present invention shown in FIG. 3.

FIG. 4 shows a circuit diagram of an equivalent circuit of the gain control circuit GC11 in the feedback type variable gain amplifier according to the present invention shown in FIG. 3.

The equivalent circuit of the gain control circuit GC11 is expressed by a series connection of an inductor L21, a variable resistor R21 and a direct-current cutoff capacitor C21. Because, as described above, the transistor FET12 and the resistor R11 of the gain control circuit GC11 function as a variable resistor.

Therefore, the impedance Z of the gain control circuit GC11 is represented as follows:

$$Z = R(Vgc) + j\{\omega L - (1/\omega C)\}$$

where R(Vgc) is a variable resistance value between the drain and the source of the transistor FET12.

A phase difference of a voltage to a current flowing through the circuit is represented as follows:

$$\theta = \tan^{-1}[\{\omega L - (1/\omega C)\}/R(Vgc)]$$

That is to say, in the feedback type variable gain amplifier according to the present invention, the direct phase difference between the input voltage and the output voltage vary in the range $-90° < \theta < 90°$, while the variable range of that in the conventional feedback type variable gain amplifier is $-90° < \theta < 0°$.

The values of the inductance of the inductor L12 and the capacitance of the capacitor C11 should be set the proper values so that the phase difference between the signal supplied to the amplifier AMP11 and the signal fedback via the gain control circuit GC11 is approximately 180° (about 180°±10°). In other words, the values of the inductance of the inductor L12 and the capacitance of the capacitor C11 should be set the proper values so that the voltage amplitude of the signal input terminal of the amplifier AMP11 is smaller, when the value of the variable resistance R(Vgc) is set a minimum value by controlling the voltage applied to the gain control terminal G12 of the gain control circuit GC11. In this case, the decay of the gain is larger than that when the phase difference between the input signal and the signal fedback to the input via the gain control circuit GC11 is not set at 180°.

When the amount of the signal feedback is minimized, since the resistance part R21 of the impedance Z becomes large and the signal mostly does not pass the gain control circuit GC11, the gain of the amplifier does not depend on the value of the inductance of the inductor L12 and the capacitance of the capacitor C11 which are included in the gain control circuit GC11.

In the case that the gain control is performed by controlling the voltage applied to the gain control terminal G12 of the gain control circuit GC11, the difference between "the gain at the time when the amount of the signal feedback is maximized" and "the gain at the time when the amount of the signal feedback is minimized" is the range of the gain control. And it is possible to expand the range of the gain control compared with the conventional feedback type variable gain amplifier having the narrow variable range of the phase difference. That is to say, since the second inductor is connected with the capacitor in series across the drain and the gate of the first field effect transistor, the imaginary part of the impedance of the gain control circuit including the second inductor, the second field effect transistor, the capacitor and the resistor becomes controllable so that it is possible to control the phase of the signal feedback to the signal input terminal of the amplifier and expand the range of the gain control in the high frequency bands, especially in UHF band or higher band.

According to the feedback type variable gain amplifier of the present invention, it is possible to obtain its effect in any frequency band, however, the sufficient effect is obtained in the high frequency bands, especially in UHF band or higher band.

MESFET or MOSFET may be used for the transistor FET11 and the transistor FET12. Both of the transistor FET11 and the transistor FET12 may be MESFET, or both of the transistor FET11 and the transistor FET12 may be MOSFET, or one of the transistor FET11 and the transistor FET12 may be MESFET and the other may be MOSFET.

And the conductivity type of the transistor FET11 and the transistor FET12 may be either n channel type or p channel type. Both of the transistor FET11 and the transistor FET12 may be n channel type, or both of the transistor FET11 and the transistor FET12 may be p channel type, or one of the transistor FET11 and the transistor FET12 may be n channel type and the other may be p channel type.

In the case that the same kind of field effect transistors are used for both of the transistor FET11 and the transistor FET12, the amplifier AMP11 and the gain control circuit GC11 can be fabricated on one semiconductor chip. In the case that the different kind of field effect transistors are used for the transistor FET11 and the transistor FET12, the amplifier AMP11 and the gain control circuit GC11 need to fabricate on the separate semiconductor chips.

It is possible to substitute bonding wires for the inductor L11 and the inductor L12. In the case that the amplifier AMP11 and the gain control circuit GC11 are fabricated on the separate semiconductor chips, it is necessary to connect one semiconductor chip to the other by wires. In this case, the wires function as the inductor L12.

When the feedback type variable gain amplifier of the present invention is used in higher frequency, for example, in the range of millimeter wave, a parasitic inductance is easily formed and the range of the gain control can be substantially expanded.

It is easier to control the circuit when the capacitance of the capacitor C11 is larger.

What is claimed is:

1. A feedback type variable gain amplifier comprising:
a first inductor and a first field effect transistor connected in series across a power-supply potential terminal and a ground potential terminal, the one end of said first inductor connecting to the power-supply potential terminal, the one end of said first field effect transistor connecting to the ground potential terminal, the gate of said first field effect transistor being used as a signal input terminal, and the other end of said first field effect transistor being used as a signal output terminal;
a second inductor, a second field effect transistor and a capacitor connected in series between the drain and the gate of said first field effect transistor; and
a resistor connected between the drain and the source of said second field effect transistor;

wherein the values of the inductance of said second inductor and the capacitance of said capacitor are set to proper values so that the phase difference between the signal input to the gate of the first field effect transistor and the signal feedback to the gate of the first field effect transistor goes through said second inductor, and said second field effect transistor and said capacitor is approximately 180° when the value of the resistance between the drain and the source of said second field effect transistor is set to a minimum value by controlling the voltage applied to the gate of said second field effect transistor.

2. A feedback type variable gain amplifier according to claim 1, wherein both of said first field effect transistor and said second field effect transistor are MESFET.

3. A feedback type variable gain amplifier according to claim 1, wherein both of said first field effect transistor and said second field effect transistor are MOSFET.

4. A feedback type variable gain amplifier according to claim 1, wherein one of said first field effect transistor and said second field effect transistor is MESFET and the other is MOSFET.

5. A feedback type variable gain amplifier according to claim 4, wherein said second inductor is a wire which connects a semiconductor chip on which said first field effect transistor is provided and a semiconductor chip on which said second field effect transistor is provided.

6. A feedback type variable gain amplifier according to claim 1, wherein said first inductor and said second inductor are bonding wires.

7. A feedback type variable gain amplifier according to claim 1, wherein both of the conductivity type of said first field effect transistor and said second field effect transistor are n channel type.

8. A feedback type variable gain amplifier according to claim 1, wherein both of the conductivity type of said first field effect transistor and said second field effect transistor are p channel type.

9. A feedback type variable gain amplifier according to claim 1, wherein one of the conductivity type of said first field effect transistor and said second field effect transistor is n channel type and the other is p channel type.

10. A feedback type variable gain amplifier comprising:
a first inductor and a first field effect transistor connected in series across a power-supply potential terminal and a ground potential terminal, the one end of said first inductor connecting to the power-supply potential terminal, the one end of said first field effect transistor connecting to the ground potential terminal, the gate of said first field effect transistor being used as a signal input terminal, and the other end of said first field effect transistor being used as a signal output terminal;
a second inductor, a second field effect transistor and a capacitor connected in series between the drain and the gate of said first field effect transistor; and
a resistor connected between the drain and the source of said second field effect transistor,
wherein one of said first field effect transistor and said second field effect transistor is MESFET and the other is MOSFET; and
wherein said second inductor is a wire which connects a semiconductor chip on which said first field effect transistor is provided to another semiconductor chip on which said second field effect transistor is provided.

11. A feedback type variable gain amplifier according to claim 10, wherein the values of the inductance of said second inductor and the capacitance of said capacitor are set to proper values so that the phase difference between the signal input to the gate of the first field effect transistor and the signal fedback to the gate of the first field effect transistor goes through said second inductor, and said second field effect transistor and said capacitor is approximately 180° when the value of the resistance between the drain and the source of said second field effect transistor is set to a minimum value by controlling the voltage applied to the gate of said second field effect transistor.

12. A feedback type variable gain amplifier according to claim 10, wherein said first inductor and said second inductor are bonding wires.

13. A feedback type variable gain amplifier according to claim 10, wherein both of the conductivity type of said first field effect transistor and said second field effect transistor are n channel type.

14. A feedback type variable gain amplifier according to claim 10, wherein both of the conductivity type of said first field effect transistor and said second field effect transistor are p channel type.

15. A feedback type variable gain amplifier according to claim 10, wherein one of the conductivity type of said first field effect transistor and said second field effect transistor is n channel type and the other is p channel type.

* * * * *